United States Patent [19]
Joo

[11] Patent Number: 5,909,402
[45] Date of Patent: Jun. 1, 1999

[54] CIRCUIT FOR DRIVING/CONTROLLING SENSING AMPLIFIER

[75] Inventor: Yang-Sung Joo, Seoul, Rep. of Korea

[73] Assignee: LG Semicon Co., Ltd., Cheongju, Rep. of Korea

[21] Appl. No.: 08/991,616

[22] Filed: Dec. 16, 1997

[30] Foreign Application Priority Data

Dec. 28, 1996 [KR] Rep. of Korea ................ 96-75729

[51] Int. Cl.⁶ ................................................ G11C 7/00
[52] U.S. Cl. .................... 365/189.07; 365/189.09; 365/189.11
[58] Field of Search ................ 365/189.07, 189.11, 365/208, 189.09

[56] References Cited

U.S. PATENT DOCUMENTS

| | | | |
|---|---|---|---|
| 4,873,673 | 10/1989 | Hori et al. | 365/230.06 |
| 5,258,950 | 11/1993 | Murashima et al. | 365/189.05 |
| 5,689,461 | 11/1997 | Kaneko et al. | 365/189.07 X |
| 5,696,730 | 12/1997 | Slezak et al. | 365/189.07 X |

Primary Examiner—Do Hyun Yoo

[57] ABSTRACT

Provided is a sensing amplifier driving/controlling circuit for supplying pull-up/down voltage to a sensing amplifier of a semiconductor memory device, including: a first switching device for connecting internal voltage to the first driving line which in turn applies high voltage to the sensing amplifier; a second switching device for connecting an external voltage to the first driving line which in turn applies high voltage to the sensing amplifier; a third switching device for connecting ground voltage to a second driving line which in turn applies ground voltage to the sensing amplifier; a comparator having an inverse input terminal which is connected to the first driving line and a non-inverse input terminal which receives a reference voltage and thus the comparator is enabled when receiving first and second control signals; an inverter for inverting the first control signal and applying the inverse signal to the control input terminal of the first switching device; and a NAND gate for receiving the outputs of the comparator and the first control signal with its input terminals and performing a NAND operation.

17 Claims, 12 Drawing Sheets

CIRCUIT FOR DRIVING/CONTROLLING SENSING AMPLIFIER

BACKGROUND OF THE INVENTION

1. Field of the Invention

The present invention relates to a bit line sensing amplifier driving/controlling circuit, specifically, to a circuit for rapidly supplying pull up/down voltages to a bit line sensing amplifier, thereby reducing power consumption.

2. Discussion of Related Art

Figure 1:
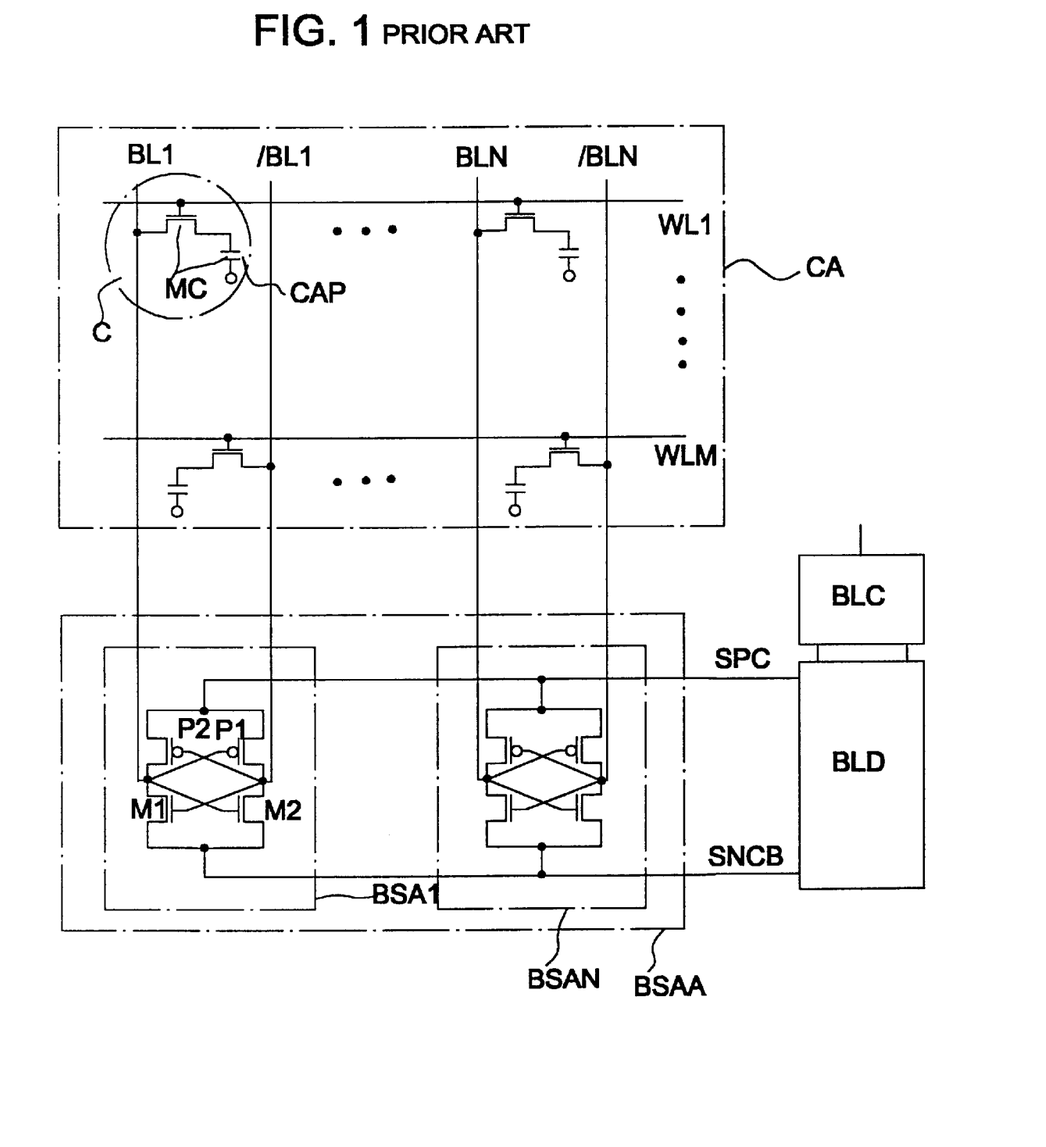
FIG. 1 illustrates a basic structure of conventional memory.

As illustrated in FIG. 1, in semiconductor devices, a memory includes a cell array CA for storing data and a bit line sensing amplifier array BSAA for amplifying the data of the cell array CA.

In the memory cell array CA, the data cells C are arranged in a N×M matrix. Each cell is connected to a word line WL and a bit line BL. The even cells are connected to one bit line BL (BL1) and the odd cells are connected with an associated bit line (/BL1). Where the cells in the cell array CA are arranged in an N×M matrix, the cell array CA has M word lines, WL1 through WLM. There is a pair of bit lines in every column. Therefore, n pairs of bit lines, BL1 and /BL1 through BLN and /BLN, form the cell memory.

A bit line sensing amplifier array BSAA, made of n bit line sensing amplifiers BSA1 to BSAN, is connected to CA. Each of the sensing amplifiers is connected to a pair of bit lines (BL:/BL) to amplify the potential difference (voltage) between the two bit lines, thus sensing data held in the cell. These sensing amplifiers comprise pull-up devices made of first and PMOS transistors P1 and P2, connected in series with pull-down devices, made of first and second NMOS transistors M1 and M2, between the first and second driving lines SPC and SNCB. The gates of the first and second PMOS transistors P1 and P2 being connected to the first and second bit lines BL and /BL, respectively, and the gates of the first and second NMOS transistors M1 and M2 being connected to the first and second bit lines /BL and BL, respectively.

A bit line driver BLD is connected to the bit line sensing amplifier array BSAA through driving lines SPC and SNCB, thus supplying the voltage for driving the bit line sensing amplifiers BSA1 to BSAN. The PMOS transistors serving as the pull-up devices for the sensing amplifiers are commonly connected to the first driving line SPC of the bit line driver BLD, and the NMOS transistors serving as the pull-down devices are connected to the second driving line SNCB of the bit line driver. The bit line driver BLD applies a positive operational voltage VCC to the first driving line SPC and grounds the second driving line SNCB according to a control signal generated by the bit line controller BLC.

The operation of the previously described driving/controlling circuit, as illustrated in FIG. 1, will be described with reference to FIG. 3.

When high state voltage data is stored in a cell in the memory cell array, the bit line /BL, which is paired with another bit line BL connected to the cell C and is preset to a voltage which is of a half potential level (VBLP), receives a driving voltage applied to the word line connected to the cell. When this occurs, a pass transistor MC corresponding to cell C is turned on and the charge in a capacitor CAP is discharged to bit line BL1. In other words, a charge redistribution occurs. The potential of the bit line BL preset to VBLP differs from the potential of the bit line /BL, to which the charge of the capacitor CAP is applied and produces a potential difference ΔV between the two bit lines. Thus the bit line driver BLD applies VCC to the first driving line SPC and VSS (i.e., ground) to the second driving line SNCB.

Figure 3:
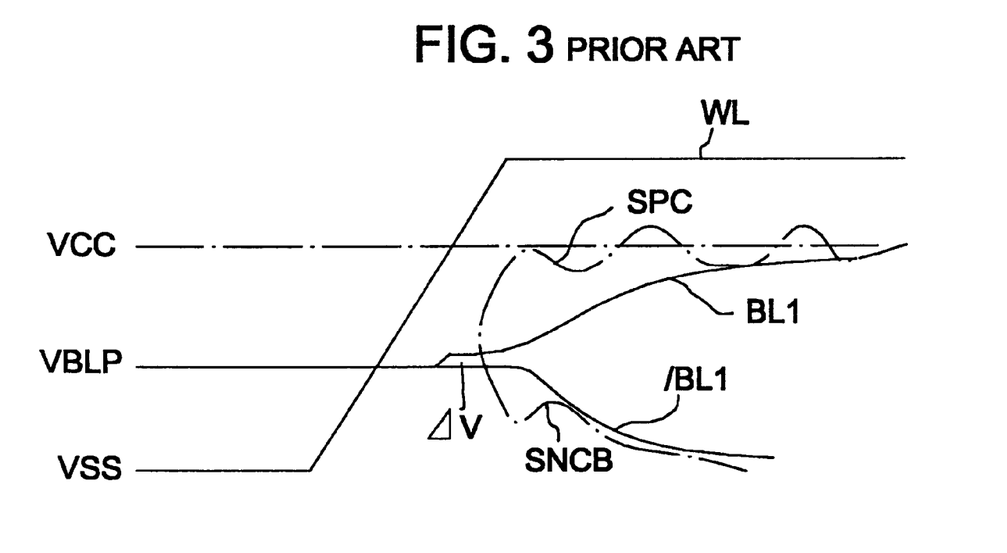
FIG. 3 illustrates operational waveform of the circuit of FIG. 2.

As illustrated in FIG. 3, when the potential of BL1 is increased and the potential of /BL1 is decreased so that the data stored in capacitor CAP is read through the data bus connected to the sensing amplifier; the same data can be stored in the cell. Thus, if the driving voltage is applied to the sensing amplifier, the voltage Vgs between the gate and the source of the second NMOS transistor M2, serving as a pull-down transistor in the sensing amplifier and connected to the second driving line SNCB, is higher than the Vgs of the first NMOS transistor M1 by ΔV. Therefore, the second NMOS transistor M2 is turned on before the first NMOS transistor M1, and the charge of the second bit line /BL1 is discharged before first bit line BL1. Accordingly, the vgs value of the first NMOS transistor M1 is decreased and the discharge path of the first bit line BL1 is cut off.

In contrast, the PMOS transistor serving as the pull-up device for the sensing amplifier operates as follows.

As the Vsg of the first PMOS transistor P1, whose gate is connected to the first bit line BL1, is higher than that of the second PMOS transistor P2, whose gate is connected with the second bit line /BL1, the first PMOS transistor P1 is turned on earlier. Consequently, the first bit line /BL1 is pulled up and the discharge current path is cut off. The pull-up transistor P2 is turned off and cuts off the supply of positive voltage to the bit line /BL1. The positive voltage VCC is applied to the bit line BL1, thereby increasing the bit line BL1 voltage to a predetermined level.

Figure 2:
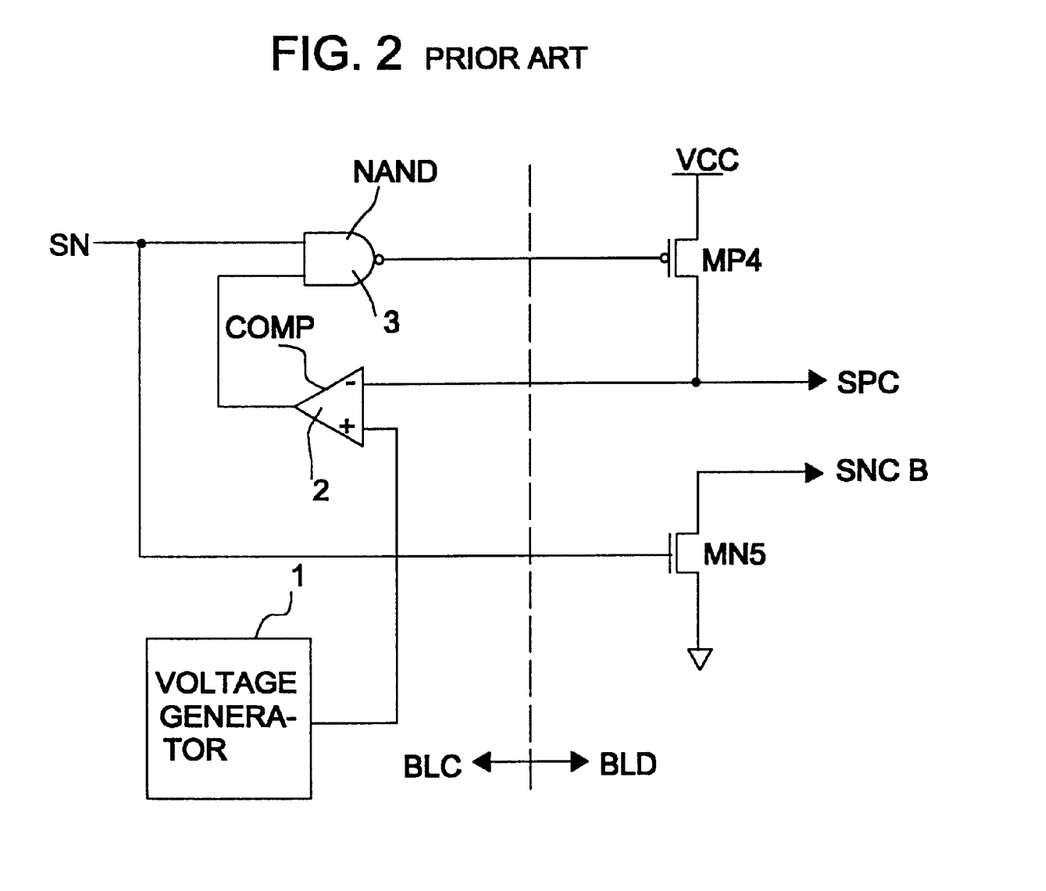
FIG. 2 is a circuit diagram of a conventional sensing amplifier driving/controlling circuit.

FIG. 2 illustrates an example embodiment of the sensing amplifier driving/controlling circuit which has the bit line driver BLD for a driving the bit line sensing amplifier, and the controller BLC.

The conventional sensing amplifier driving/controlling circuit has a voltage generator 1 for generating a predetermined reference voltage VREF; a comparator 2 having a non-inverse data input terminal + for a receiving reference voltage generated by voltage generator 1, and an inverse data input terminal −, connected to the first driving line SPC, to thereby compare the two signals; NAND gate 3 for receiving an output signal of the comparator 2 and a control signal SN, that is externally input, to perform a NAND operation on the two signals; an NMOS transistor MN5 that turns on or off according to the control signal and selectively connects the second driving line SNCB to the ground voltage; and a PMOS transistor MP4 that turns on or off according to the output of the NAND gate 3 and selectively connects the positive voltage VCC to the first driving line SPC.

With reference to FIG. 3, the operation of the described sensing amplifier driving/controlling circuit is described below.

After the word line WL is enabled, when the control signal SN of the bit line sensing amplifier BSAA is converted from a low state into a high state, the NMOS transistor MN5 is turned on so that the potential of the second driving line SNCB, which is charged at ½ VCC as well as the bit line; is discharged and reduced to the ground voltage. Furthermore, as the output signal of comparator 2 is in a high state, because the output voltage of the voltage generator 1 is set higher than the ½ VCC, the output of the NAND gate becomes high when the control signal SN is in a low state. If the control signal is switched from a low state to a high state, the output of the NAND gate changes from the high state to the low state, thereby turning on PMOS transistor 4. Accordingly, as the PMOS transistor 4 is turned on, positive voltage VCC is applied to first driving line SPC, pulling up the first driving line SPC from the ½ VCC state to the VCC state.

In this way, the voltage applied to the first driving line SPC is input to the inverse data input terminal − of the comparator 2. Comparator 2 compares it to the reference voltage VREF, applied through its non-inverse data input terminal +, and if it is higher than reference voltage VREF, comparator 2 applies the low state signal to one input terminal of the NAND gate NAND 3, converting the output of the NAND gate 3 into the high state. Consequently, PMOS transistor 4 is turned off, cutting off the VCC supply to the first driving line SPC. The voltage of the reference voltage VREF is determined by the expected voltage of the first driving line SPC, and is generally set to a level suitable for being restored in the cell similar to the level of the positive voltage VCC.

As illustrated in FIG. 3, the voltage applied to the first driving line SPC oscillates continuously because the voltage is controlled by the output of the comparator 2 while the control signal SN is in a high state.

The technique for driving/controlling the bit line of the described conventional driving/controlling sensing amplifier has a problem with consuming excessive power because the comparator 2 is always in the active state.

To overcome the problems with the conventional sensing amplifier driving/controlling circuit resulting in excessive power consumption, a technique described in U.S. Pat. No. 5,258,950 has been developed. The technique employs the circuit of FIG. 4. The operation of the circuit is described below with reference to FIG. 5.

Figure 4:
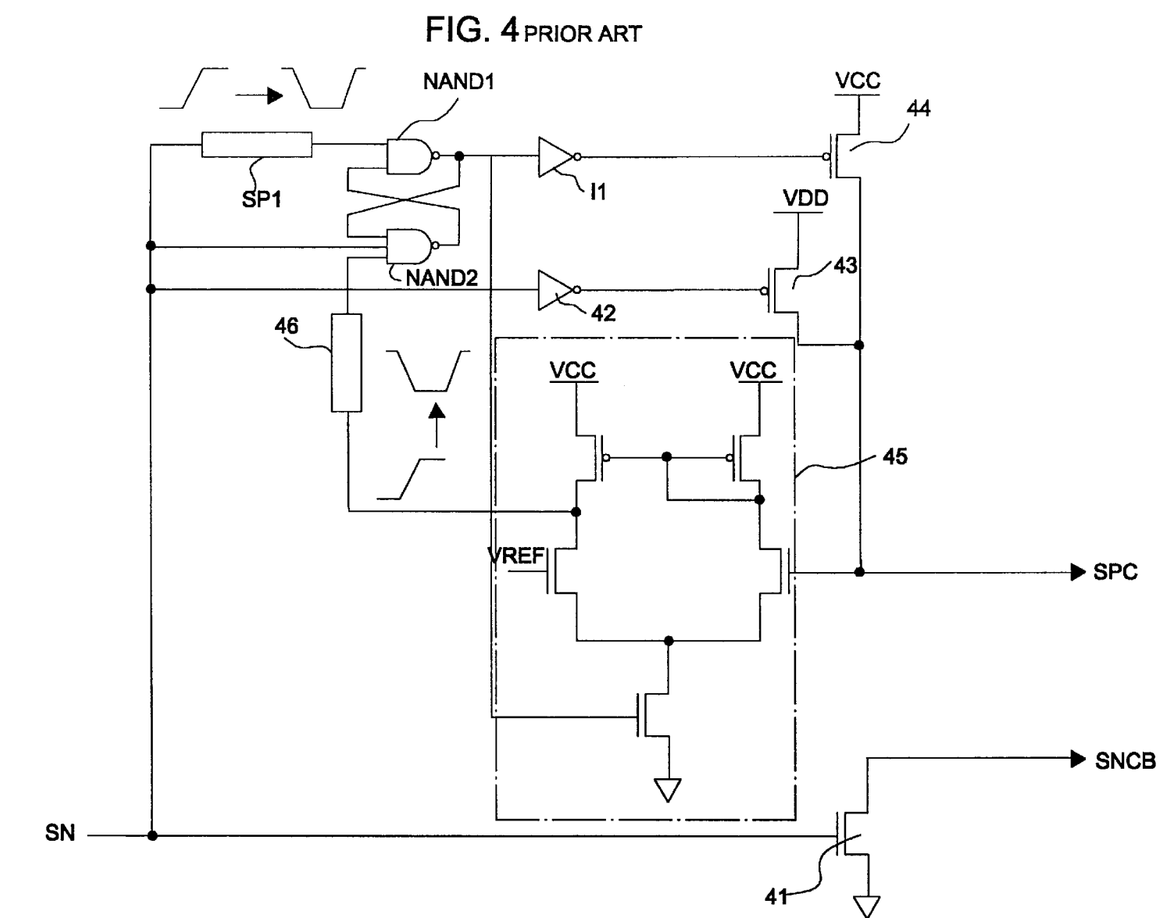
FIG. 4 is a circuit diagram of a conventional sensing amplifier driving/controlling circuit.

After a word line WL is enabled, and if a control signal SN of a bit line sensing amplifier BSAA is switched from low to high, an NMOS transistor 41, is turned on and discharges the second driving line SNCB to the ground voltage.

The control signal SN becomes low after passing through a second inverter 42, and is applied to the gate of a second PMOS transistor 43 to turn on the transistor. Accordingly, the internal voltage VDD is applied to the first driving line SPC. Furthermore, the control signal SN changes from high to low by passing through a pulse generator SP1 and a latch circuit having first and second NAND gates NAND1 and NAND2, and therefore is used for turning on the first PMOS transistor 44. The first driving line SPC is pulled up rapidly with the internal voltage VDD and the external voltage VCC by turning on the first and second PMOS transistors 44 and 43.

The voltage pulled up in the first driving line SPC becomes higher than the reference voltage and similar to the internal voltage VDD. Thus, the VREF voltage is set lower than the external voltage VCC and higher than the internal voltage VDD. Under these conditions, a current mirror typed comparator 45 changes the voltage of the output line connected to a short low pulse generator 46, where the first driving line SPC is at a VDD level, to generate a short low pulse using short low pulse generator 46, the pulse to the second NAND gate NAND2. In accordance with this, the signal input to the gate of the first PMOS transistor 44 becomes high.

At the initial stage of the operation, the first and second PMOS transistors 44 and 43, respectively connecting the external voltage VCC to the first driving line and the internal voltage VDD to the second driving line, operate at the same time. If the voltage applied to the first driving line SPC is higher than the reference voltage VREF, only the second PMOS transistor 43, operating with the internal voltage VDD, is continuously in the "ON" state, and the first PMOS transistor 44, for supplying the external voltage VCC to the first driving line SPC, is turned off to thereby reduce power consumption while maintaining the voltage of the first driving line SPC. The first PMOS transistor 44, supplying the external voltage VCC to the first driving line SPC, is turned off to reduce power consumption, thus maintaining the voltage level of the first driving line.

Figure 5:
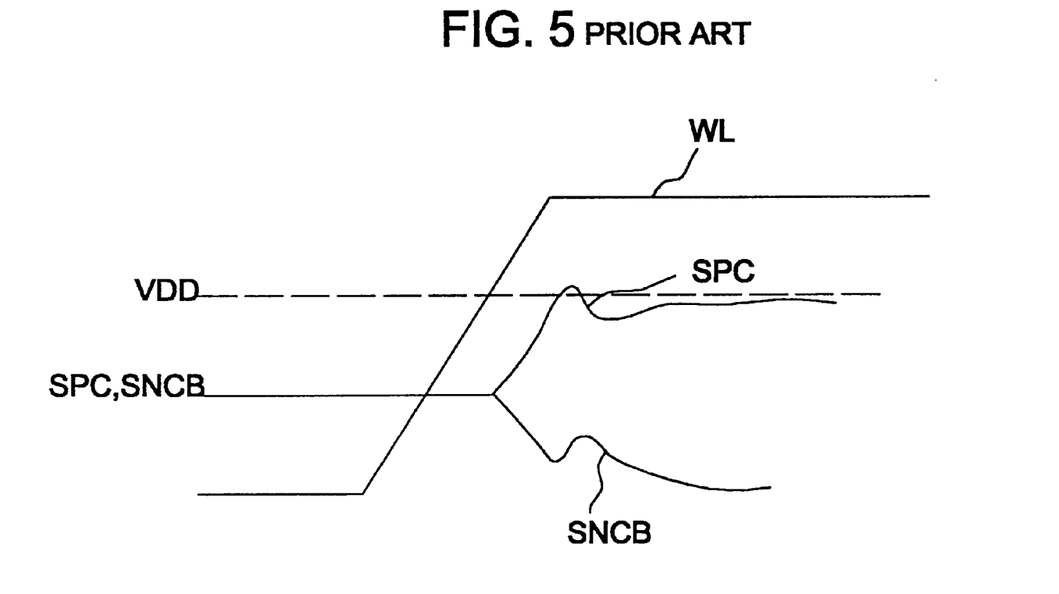
FIG. 5 illustrates the waveform of the circuit of FIG. 4.

FIG. 5 illustrates the wave form of the voltage applied to each signal line when operating the sensing amplifier driving/controlling circuit.

To solve the problem of the conventional art, the circuit is designed to operate the comparator 45 only during an initial stage of the pull-up operation. As the first driving line SPC is not a simple passive device, as illustrated in FIG. 5, the voltage of the first driving line SPC is drastically decreased when the first PMOS transistor 44 is turned off, thus its wave form is peak-shaped. Consequently, even though the power consumption is reduced, it takes too much time to pull up the first driving line SPC to a stable internal voltage VDD level.

Additionally, if the voltage applied to the first driving line SPC is not higher than the reference voltage VREF while the bit line sensing amplifier BSAA is enabled, output from the latch circuit is not converted even though the enable signal SN is reset. As the output signal of the first inverter maintains the low state, excessive power consumption results. Furthermore, the construction of the latch circuit may be complex.

With memory devices a burn-in test is performed under conditions of high-voltage and high-temperature to detect devices having poor reliability. Here, the external high voltage directly applied to the cell inside the chip through the VCC line may damage the devices.

SUMMARY OF THE INVENTION

Accordingly, the present invention is directed to a sensing amplifier driving/controlling circuit that substantially obviates one or more of the problems, limitations, and disadvantages of the related art.

An objective of the present invention is to provide a sensing amplifier driving/controlling circuit which restricts the comparator using a control signal generated by delaying the enable control signal SN of the bit line sensing amplifier BSAA, thus reducing power consumption, improving the operational speed, and thereby preventing excessive external voltages from being directly applied to the sensing amplifier driving line, and increasing the reliability of the memory device.

Additional features and advantages of the invention will be set forth in the description which follows, and in part will be apparent from the description, or may be learned by practice of the invention. The objectives and other advantages of the invention will be realized and attained by the structure particularly as pointed out in the written description and claims hereof as well as the appended drawings.

To achieve these and other advantages and in accordance with the purpose of the present invention, as embodied and broadly described, a sensing amplifier driving/controlling circuit for supplying pull-up/down voltage to a sensing amplifier of a semiconductor memory device of the invention includes: a first switching device for connecting internal voltage to the first driving line, which in turn applies high voltage to a sensing amplifier; a second switching device for connecting external voltage to the first driving line, which in turn applies high voltage to the sensing amplifier; a third switching device for connecting ground voltage to a second driving line, which in turn applies ground voltage to the sensing amplifier; a comparator having an inverse input terminal connected to the first driving line and a non-inverse input terminal receiving reference voltage which is enabled after receiving first and second control signals; an inverter for inverting the first control signal and applying an inverted signal to the control input terminal of the first switching device; and a NAND gate for receiving the output of the comparator and the first control signal, with its input terminals, and performing a NAND operation.

It is to be understood that both the foregoing general description and the following detailed description are exemplary and explanatory, and thus are intended to provide further explanation of the invention as claimed.

BRIEF DESCRIPTION OF THE ATTACHED DRAWINGS

The accompanying drawings, which are included to provide a further understanding of the invention, are incorporated in and constitute a part of this specification, illustrate embodiments of the invention that serve to explain the principles of the invention together with their description wherein like reference numerals refers to like components, and wherein.

DETAILED DESCRIPTION OF PREFERRED EMBODIMENT

Reference will now be made in detail to the preferred embodiments of the present invention, examples of which are illustrated in the accompanying drawings.

Figure 6:
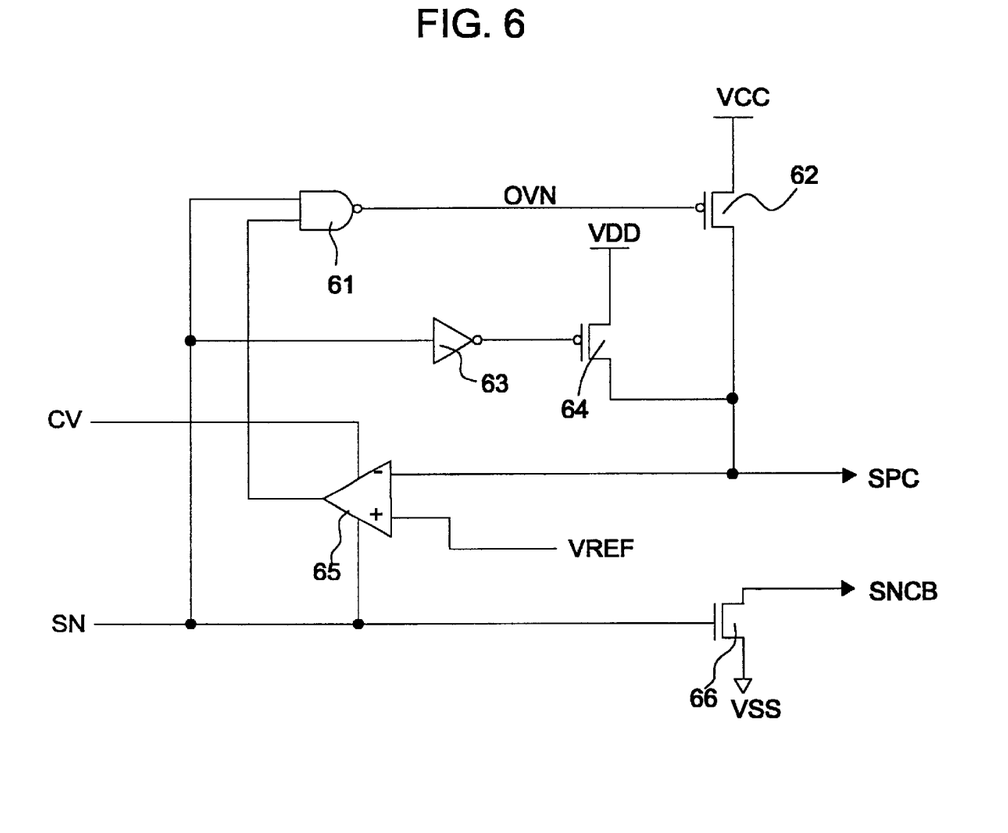
FIG. 6 is a circuit diagram of a bit line sensing amplifier driving/controlling circuit of the invention.

FIG. 6 is a circuit diagram of a sensing amplifier driving/controlling circuit of the invention. The circuit includes a first switching circuit 64 (e.g., a PMOS transistor) for connecting internal voltage VDD to first driving line SPC, which in turn applies high voltage to a sensing amplifier; a second switching device 62 (e.g., a PMOS transistor) for connecting external voltage VCC to the first driving line SPC, which in turn applies high voltage to the sensing amplifier; a third switching device 66 (e.g., an NMOS transistor) for connecting ground voltage VSS to a second driving line SNCB, which in turn applies ground voltage to the sensing amplifier; a comparator 65 having an inverse input terminal connected to the first driving line SPC, and a non-inverse input terminal for receiving a reference voltage VREF, which is enabled when receiving first and second control signals SN and CV; an inverter 63 for inverting the first control signal SN and applying the inverted signal to the control input terminal of the first switching device 64; and a NAND gate 61 for receiving the output of the comparator 65 and the first control signal SN through two input terminals and performing a NAND operation.

Figure 7:
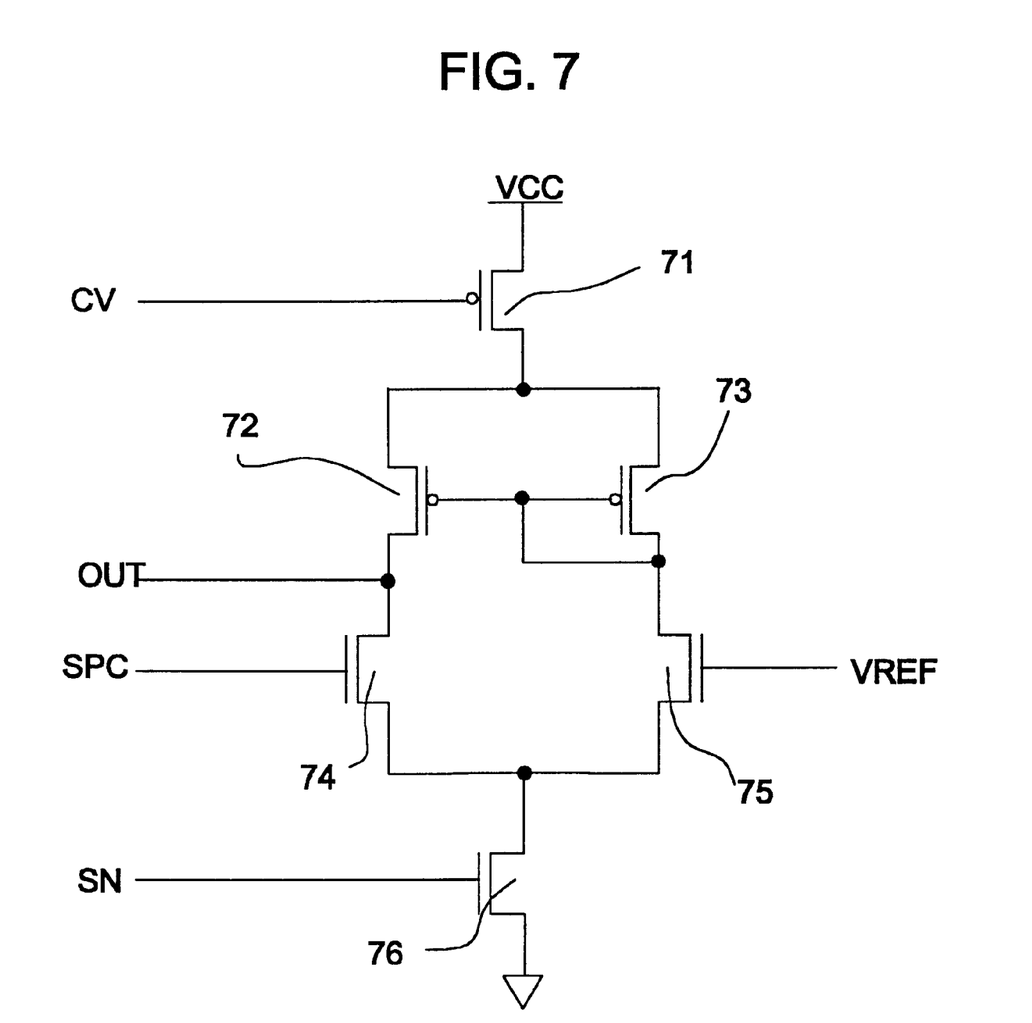
FIG. 7 is a circuit diagram of a comparator of the invention.

FIG. 7 is a detailed circuit diagram of comparator 65. The comparator 65 includes a first NMOS transistor 76 having its source connected to ground and its gate receiving the first control signal SN; a second NMOS transistor 74 having its source connected to the drain of the first NMOS transistor 76 and its gate connected to the first driving line SPC; a third NMOS transistor 75 having its source connected to the drain of the first NMOS transistor 76 and its gate receiving the reference voltage VREF; a first PMOS transistor 73 having its gate and its drain connected in common to the drain of the third NMOS transistor 75; a second PMOS transistor 72 having its drain connected to the second NMOS transistor 74 and its gate commonly connected to the gate of the first PMOS transistor 73; and a third PMOS transistor 71 having its drain connected with the common source of the first PMOS transistor 73 and the second PMOS transistor 72, its gate receiving the second control signal CV, and its source receiving external voltage VCC.

The comparator of FIG. 7 additionally has the third PMOS transistor 71, which is turned on or off by the second control signal and has the construction of the conventional comparator described in U.S. Pat. No. 5,258,950. The comparator of the invention is enabled only when the first and second control signals SN and CV are applied simultaneously. The second control signal CV is made by delaying the first control signal a predetermined period of time while maintaining its original wave form.

The comparator 65 operates as follows. When both the first and second control signals SN and CV become LOW, the first NMOS transistor 76 is turned off by the first control signal SN. As the third PMOS transistor 71 is turned on when the second control signal CV is LOW, a high voltage is output through the output terminal OUT.

When the first control signal SN becomes HIGH, the first NMOS transistor 76 is turned on and the comparator 65 is enabled. In the initial state, where the first driving line SPC is not pulled up, the voltage of the first driving line SPC is lower than the reference voltage VREF so that the third NMOS transistor 75 is turned on and produces a high voltage state at output terminal OUT. When the voltage of the first driving line SPC is higher than the reference voltage VREF, the third NMOS transistor 75 is turned off and the second NMOS transistor 74 is turned on, causing a low voltage state at output terminal OUT. The current driving power of the second NMOS transistor 74 is larger than that of the third NMOS transistor 75.

When the second control signal is HIGH, the third PMOS transistor 71 is turned off and the comparator is disabled. As the first control signal SN has not changed to the low state yet and the first NMOS transistor 76 is turned on, a low voltage state is produced at output terminal 77 OUT. When the first control signal is in the low state, the first NMOS transistor 76 is turned off and therefore the comparator is disabled.

The operation of circuit of FIG. 6 is described below with reference of FIGS. 1, 6, 7 and 8.

Before the word line and is enabled, the bit line, first and second driving lines SPC and SNCB are equalized at half the bit line voltage and float when the first and second control signals SN and CV are in the low state.

In the comparator 65, when the second control signal CV is in the low state, the voltage of the first driving line SPC is lower than the reference voltage, a high state signal is output through the OUT terminal and the first control signal becomes the high state, the comparator 65 starts to operate normally.

Even though the output of the comparator 65 is in a high state when the first control signal SN is in a low state, the output node OVN of the NAND gate 61 becomes HIGH so that the second switching device 62 is in off state.

Figure 8:
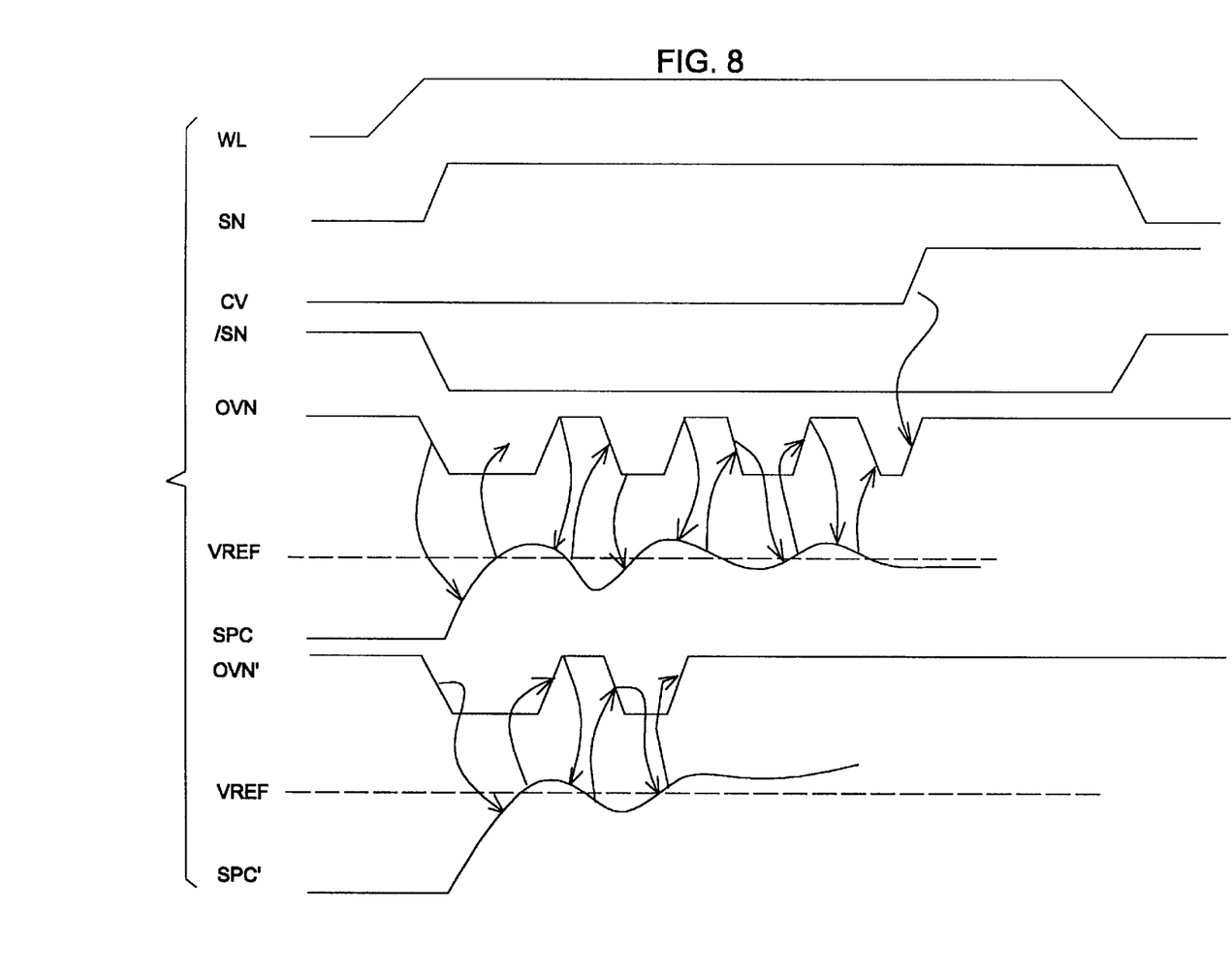
FIG. 8 illustrates an example of the operational waveform of the invention.

In this state, as illustrated in FIG. 8, and when the word line WL is enabled in the high state, the first control signal SN for operating the bit line sensing amplifier BSAA is converted from the low state to the high state after a predetermined delay. Accordingly, as the first control signal SN becomes HIGH, the third switching device 66 is turned on to pull the second driving line SNCB down to ground potential VSS. Simultaneously, the first control signal becomes LOW, through inverter 63, to turn on the first switching device 64 and supply internal voltage VDD to the first driving line SPC.

When the OUT terminal of the comparator 65 is HIGH and the first control signal SN is high, the output node OVN of the NAND gate 61 becomes LOW and the second switching device 62 is turned on. The external voltage VCC rapidly pulls up the first driving line SPC through the second switching device.

When the voltage of the first driving line SPC is pulled up above the reference voltage VREF, the output of the comparator 65 becomes LOW. Accordingly, as shown in FIG. 8., the output of the NAND gate 61 becomes HIGH, thus turning off the second switching device 62. As the second switching device 62 is for rapidly pulling up the first driving line SPC with an externally applied voltage VCC, it is desirable to turn off the first driving line SPC to reduce power consumption after the line is pulled up above a predetermined voltage. The first switching device 64 which supplies the internal voltage VDD cannot endure the active load of the first driving line SPC, and therefore the voltage is reduced. With the load of the first driving line SPC below the reference voltage, the output of the comparator 65 becomes HIGH again, the output of the NAND gate 61 becomes LOW, and the second switching device 62 is accordingly turned on and receives the external voltage VDD.

This operation continues for a predetermined period of time until the second control signal CV, for stopping the operation of the comparator 65 goes HIGH, and the third PMOS transistor 71 of FIG. 7 is turned off. Since the first and third NMOS transistors 76 and 75 are still on, the output of the comparator 65 goes LOW, and the comparator 65 stops operating. If the comparator 65 is disabled, the second switching device 62 is turned off and stops overdriving the first driving line SPC.

Even though it is before the second control signal CV, for stopping the comparator, becomes HIGH, if the voltage of the first driving line SPC is higher than the reference voltage (refer to SPC' of FIG. 8), the second switching device 62 is turned off, and stops overdriving the first driving line SPC (refer to OVN' of FIG. 8).

Figure 9:
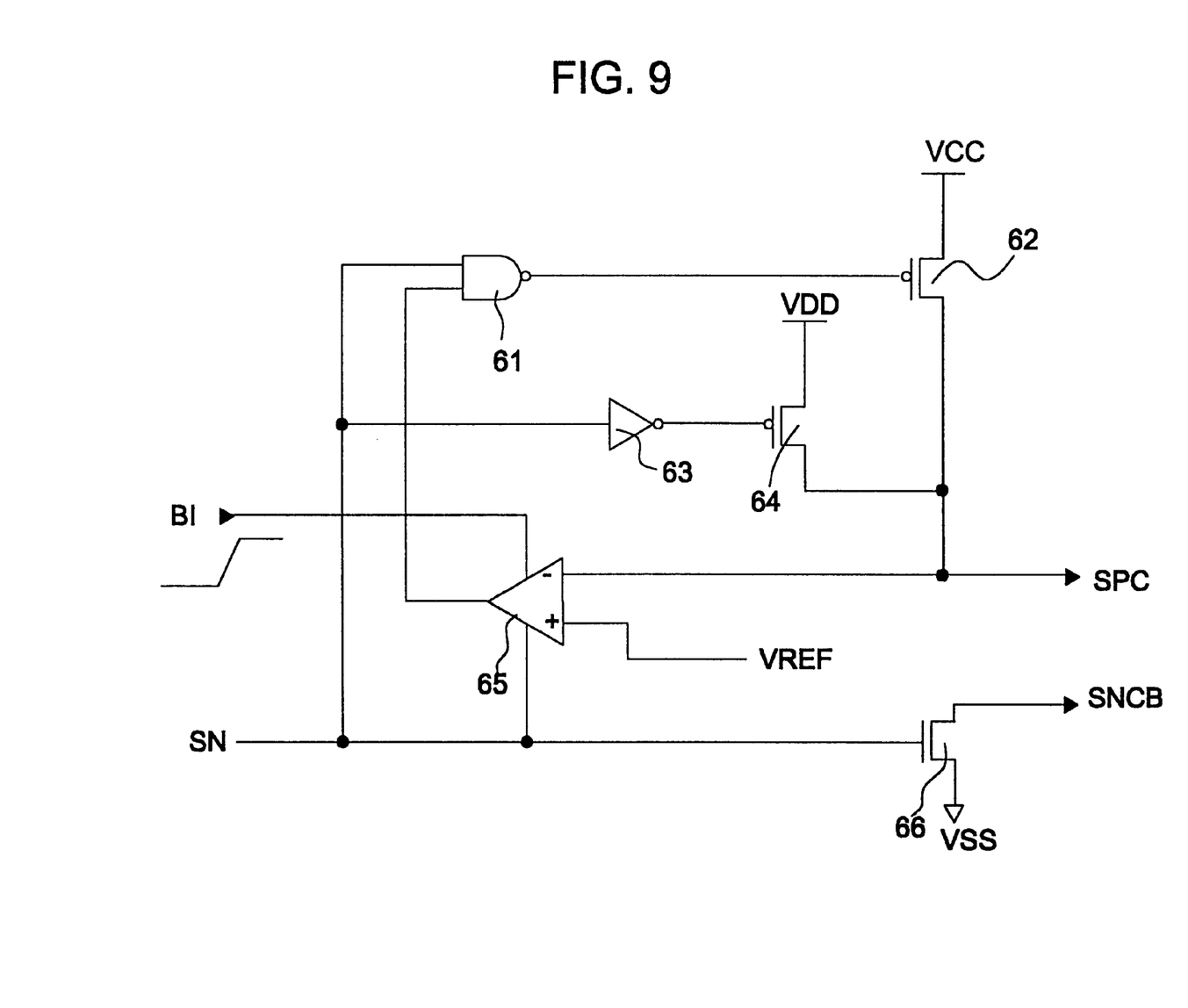
FIG. 9 is circuit diagram of the invention under conditions of a burn-in test.

FIG. 9 illustrates the circuit of FIG. 6, under burn-in testing.

Instead of the second control signal (i.e., the comparator 65 disabling signal, made by delaying the first control signal SN for the period of time), a high state burn-in test signal BI is applied to the gate of the third PMOS transistor 71 to stop the opeation of the comparator 65 initially, and thus stop the overdriving function of the second switching device 62.

Figure 10:
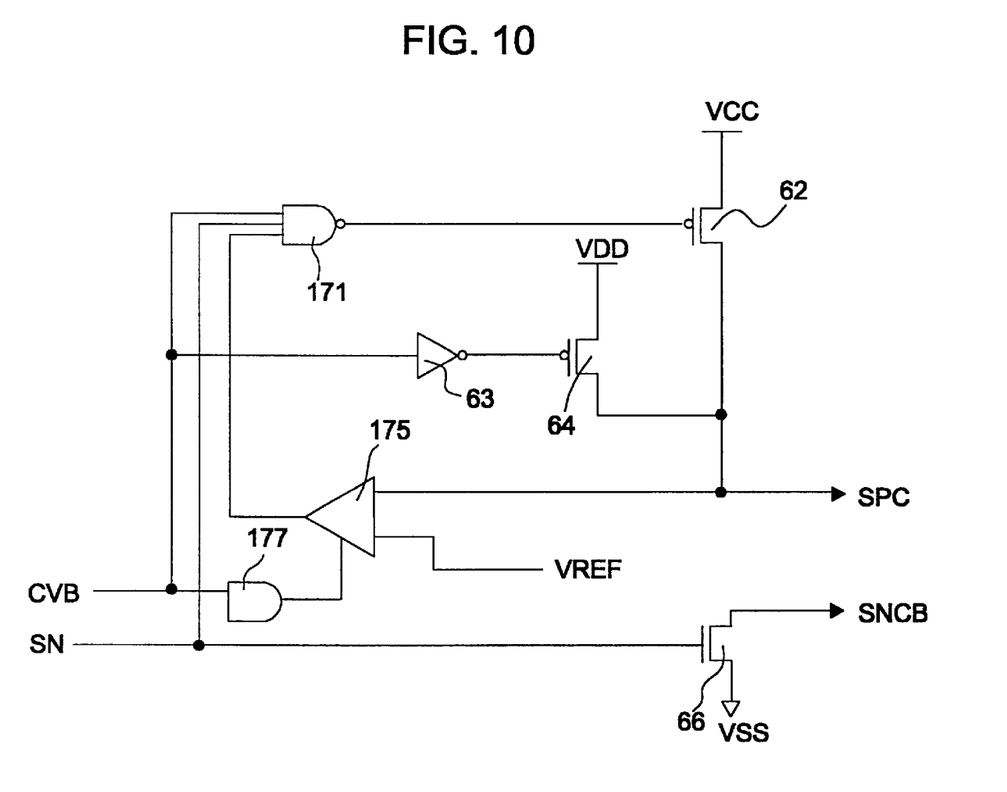
FIGS. 10 to 12 are circuit diagrams illustrating another embodiment of the invention.

FIG. 10 illustrates another embodiment of the invention. The embodiment is different from the embodiment of FIG. 6 in that a tri-input NAND gate 171 is used instead of a dual-input NAND gate 61; a conventional comparator 175 is instead of comparator 65; and the first and second control signals are cooperatively used as the enable signals of the comparator 175 through an AND gate 177. The objective of this embodiment is the same as that of FIG. 6.

In this embodiment, for the second control signal CVB, is formed by inverting the second control signal CV in the embodiment of FIG. 6. The second control signal CV is made by delaying the first control signal SN a predetermined period of time. The second control signal CVB has a waveform that is initially HIGH and becomes LOW a predetermined time after SN becomes HIGH.

The operation of the circuit of FIG. 10 is as follows.

If the first control signal SN is high, the third switching device 66 is turned on, pulling down the second driving line SNCB to VSS. The output of the inverter 63 is inverted to turn on the first switching device 64 so that the internal voltage VDD is applied to the first driving line SPC. Accordingly, as the first and second control signals SN and CVB and the output of the comparator 175 are all high, the output of the NAND gate 171 becomes LOW, turning on the second switching device 62 so that the external voltage VCC is supplied to the first driving line SPC to over-drive the first driving line SPC. If the voltage of the first driving line SPC is higher than VREF, the output of the comparator 175 becomes LOW and the output of the NAND gate 171 changes and turns off the second switching device 62, stopping the overdriving operation. If the second control signal CVB becomes LOW, the comparator 175 is disabled to stop the overdriving operation.

Figure 11:
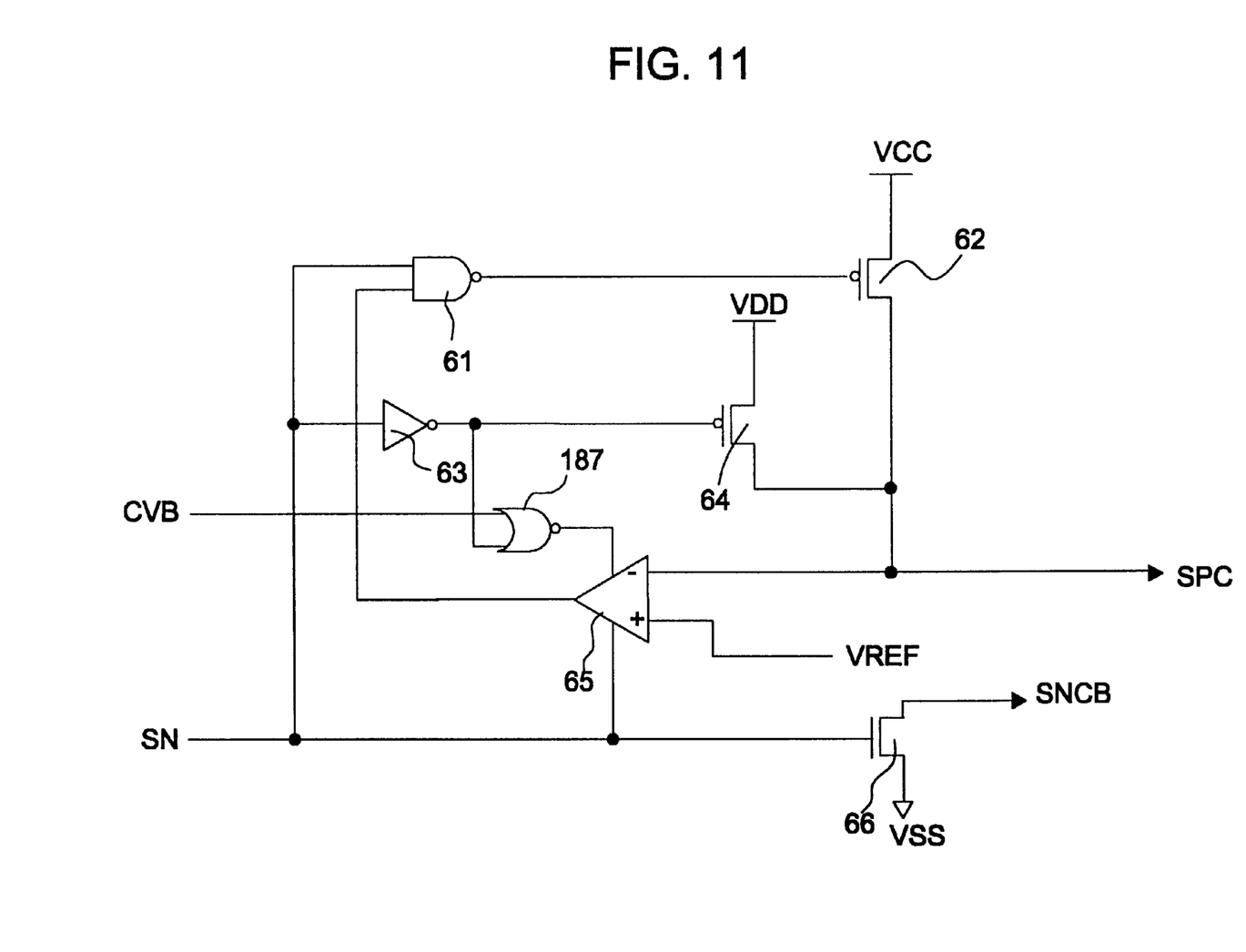

FIG. 11 shows still another embodiment of the invention. The embodiment of FIG. 11 is the same as the embodiment of FIG. 6 except that the third PMOS transistor 71 receives the output of a NOR gate 187 which, NORs the second control signal CVB and the output of the inverter 63. In this embodiment, the second control signal CVB is made.

In this embodiment, to enable the comparator 65, the signal obtained by inverting the first control signal SN is subjected to a NOR operation with the second control signal CVB, and applied to the comparator 65 so that if the first control signal SN is high and the second control signal CVB is low, the third PMOS transistor 71 of the comparator 65 is turned off, thereby disabling the comparator 65.

The circuit operates as follows. When the first control signal SN is switched HIGH, the third switching device 66 is turned on, pulling down the second driving line SNCB to VSS. An output of the inverter 63 is inverted to turn on the first switching device 64, so that the internal voltage VDD is applied to the first driving line SPC. Accordingly, when the first and second control signals SN and CVB and an output of the comparator 65 are all high, the output of the NAND gate 61 becomes LOW, turning on the second switching device 62 so that the external voltage VCC is supplied to the first driving line SPC to over-drive the first driving line SPC. If the voltage of the first driving line SPC is higher than VREF, the output of the comparator 65 becomes LOW and the output of the NAND gate 61 changes, turning off second switching device 62; thus stopping the over-driving operation. If the second control signal CVB becomes LOW, the comparator 65 is disabled to stop the over-driving operation. Other operations are the same as the circuit of FIG. 6.

Figure 12:
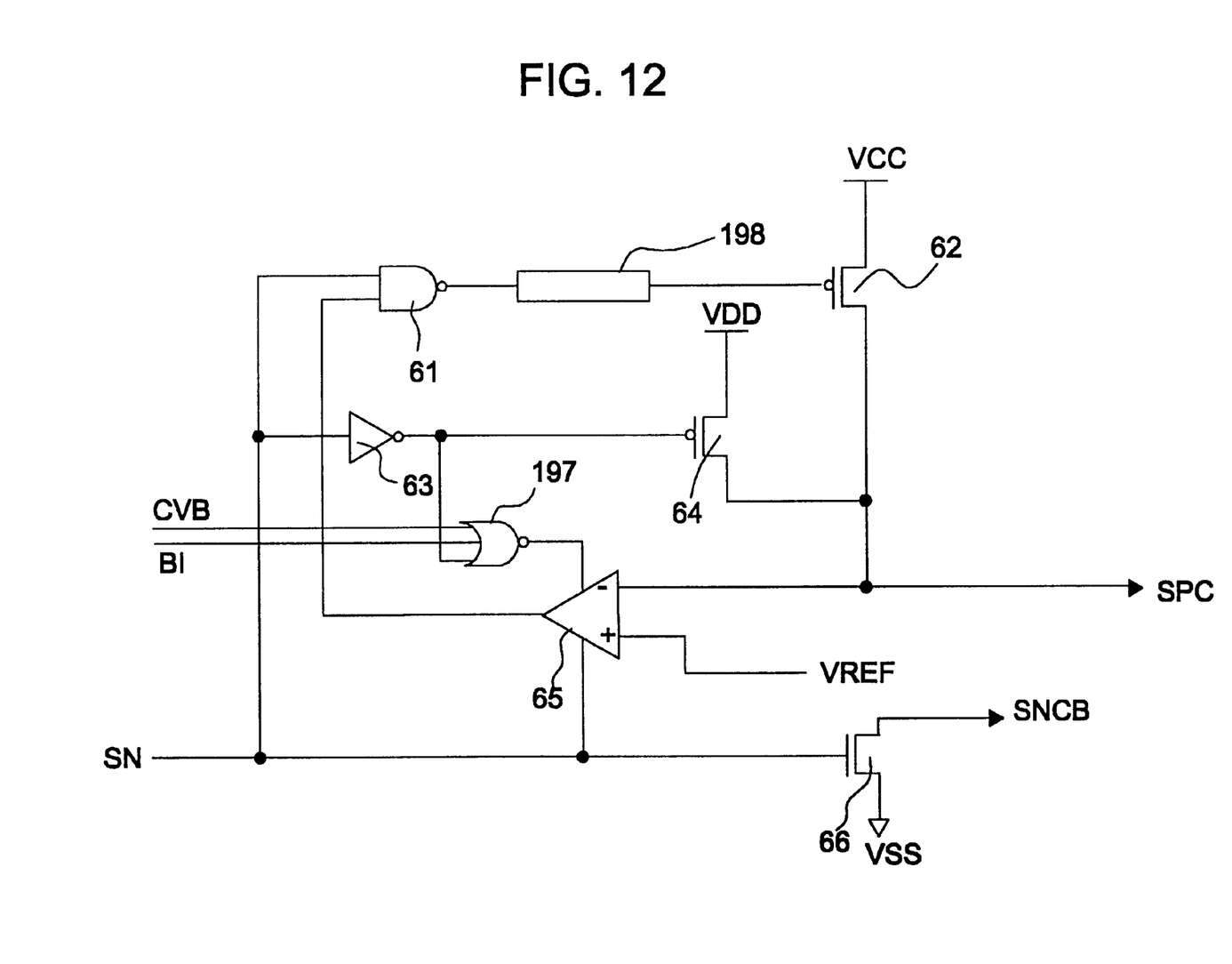

FIG. 12 shows yet another embodiment of the invention. The embodiment of FIG. 12 is the same as the embodiment of FIG. 11 except that the two input NOR gate 187 has been replaced with a three input NOR gate 197 and a level shifter 198 has been disposed between the NAND gate 61 and the second switching device 62. In this embodiment the second control signal CVB, made by delaying and inverting the first control signal as in FIG. 10, and the burn-in test signal BI for disabling the comparator 65 in the burn-in test are supplied as inputs to the NOR gate 197 along with the output of inverter 63. The output of the NOR gate 197 is applied to the gate of the third PMOS transistor 71.

The circuit of FIG. 12 operates as follows. When first control signal SN is high, the third switching device 66 is turned on, and the second driving line SNCB is pulled down to VSS. The output of the inverter 63 is inverted to turn the first switching device 64 on so that the internal voltage VDD is applied to the first driving line SPC. Accordingly, when the first and second control signals SN and CVB and an output of the comparator 64 are all high, the output of the NAND gate 61 becomes LOW, turning on the second switching device 62 so that the external voltage VCC is applied to the first driving line SPC to over-drive the first driving line SPC. If the voltage of the first driving line SPC is higher than VREF, the output of the comparator 65 becomes LOW and the output of the NAND gate 61 changes, turning off the second switching device 62 and stopping the overdriving operations. In this case, the operational power source of the logic circuits and the comparator 65 is lower than the external power voltage VCC, the voltage sufficient to turn off the second switching device 62 is applied to its control input terminal using a level shifter 198. If the second control signal CVB becomes LOW, the comparator 65 is disabled to stop the overdriving operation. During the burn-in test, as the burn-in test signal is high, the comparator 65 maintains the disabled state, thereby preventing damage to the memory device.

Therefore, with this apparatus and method for controlling a bit line sensing amplifier in semiconductor memory devices, the technique of overdriving the bit line sensing amplifier can be repeatedly operated for a predetermined period, thereby improving the bit line restoring speed, moreover, reducing power consumption by resetting the system other than the operational period of the comparator.

It will be apparent to those skilled in the art that various modifications and variations can be made in the circuit for driving/controlling sensing amplifier of the present invention without departing from the spirit or scope of the invention. Thus, it is intended that the present invention cover the modifications and variations of this invention that come within the scope of the appended claims and their equivalents.

What is claimed is:

1. A semiconductor device, comprising:
 a memory cell array;
 a sense amplifier array sensing bit lines of the cell array; and
 a controller controlling first and second driving lines of the sense amplifier array, the controller including,
  first and second drivers driving the first and second driving lines, respectively, based on a first control signal,
  a comparator, enabled based on the first control signal and a second control signal, comparing a first reference voltage and a voltage on the second driving line when enabled, and
  a voltage over-driver over driving the voltage on the second driving line based on output from the comparator.

2. The semiconductor device of claim 1, wherein the comparator is enabled for a predetermined period of time.

3. The semiconductor device of claim 1, wherein the comparator, when enabled, outputs a turn-on signal to the voltage over-driver when the first reference voltage is greater than the voltage on the second driving line.

4. The semiconductor device of claim 3, wherein the comparator, when enabled, outputs a turn-off signal to the voltage over-driver when the first reference voltage is less than the voltage on the second driving line.

5. The semiconductor device of claim 1, wherein the comparator, when enabled, outputs a turn-off signal to the voltage over-driver when the first reference voltage is less than the voltage on the second driving line.

6. The semiconductor device of claim 3, wherein the voltage over-driver is enabled by the output of the comparator and the first control signal.

7. The semiconductor device of claim 3, wherein the voltage over-driver is enabled by the output of the comparator, the first control signal, and the second control signal.

8. The semiconductor device of claim 1, wherein the voltage over-driver is enabled by the output of the comparator and the first control signal.

9. The semiconductor device of claim 1, wherein the voltage over-driver is enabled by the output of the comparator, the first control signal, and the second control signal.

10. The semiconductor device of claim 1, wherein the second driver is a voltage pull-up circuit enabled by the first control signal for pulling the second driving line up to a second reference voltage.

11. The semiconductor device of claim 1, wherein the first control signal is delayed by a predetermined period of time to produce the second control signal.

12. The semiconductor device of claim 11, wherein the comparator is enabled for the predetermined period of time.

13. The semiconductor device of claim 1, wherein the first control signal is delayed by a predetermined period of time and inverted to produce the second control signal.

14. The semiconductor device of claim 13, wherein the comparator is enabled for the predetermined period of time.

15. The semiconductor device of claim 1, wherein the comparator includes first and second enable inputs receiving the first and second control signals, respectively.

16. The semiconductor device of claim 1, further comprising:
 an AND gate receiving the first and second control signals; and wherein
 the comparator includes a single enable input receiving the output of the AND gate.

17. The semiconductor device of claim 1, further comprising:
 an inverter inverting the first control signal;
 an exclusive-OR gate receiving output from the inverter and the second control signal; and wherein
 the comparator includes first and second enable inputs receiving the first control signal and output from the exclusive-OR gate, respectively.

* * * * *